(12) United States Patent
Wang et al.

(10) Patent No.: US 9,577,127 B1
(45) Date of Patent: Feb. 21, 2017

(54) COMPOSITE MATERIAL FOR FLUORESCENT QUANTUM DOT MICRO-NANO PACKAGING

(71) Applicant: Tianjin Zhonghuan Quantum Tech Co., Ltd., Tianjin (CN)

(72) Inventors: Kai Wang, Tianjin (CN); Wei Chen, Tianjin (CN); Junjie Hao, Tianjin (CN); Xinhai Zhang, Tianjin (CN); Xiaowei Sun, Tianjin (CN)

(73) Assignee: Tianjin Zhonghuan Quantum Tech Co., Ltd., Tianjin (CN)

( * ) Notice: Subject to any disclaimer, the term of this patent is extended or adjusted under 35 U.S.C. 154(b) by 0 days.

(21) Appl. No.: 14/963,940

(22) Filed: Dec. 9, 2015

(30) Foreign Application Priority Data

Sep. 11, 2015 (CN) .......................... 2015 1 0576368

(51) Int. Cl.
| | |
|---|---|
| *H01L 29/06* | (2006.01) |
| *H01L 31/0384* | (2006.01) |
| *H01L 31/0352* | (2006.01) |
| *H01L 31/0216* | (2014.01) |

(52) U.S. Cl.
CPC ....... *H01L 31/0384* (2013.01); *H01L 31/0216* (2013.01); *H01L 31/035218* (2013.01)

(58) Field of Classification Search
CPC combination set(s) only.
See application file for complete search history.

(56) References Cited

U.S. PATENT DOCUMENTS

| | | | |
|---|---|---|---|
| 2007/0025139 A1* | 2/2007 | Parsons ................. | B82Y 10/00 365/151 |
| 2010/0216026 A1* | 8/2010 | Lopatin .................... | C25D 1/00 429/246 |
| 2015/0314019 A1* | 11/2015 | Sokolov ............. | A61K 49/0052 424/9.6 |
| 2015/0368553 A1* | 12/2015 | Nelson ..................... | B32B 7/12 428/323 |

OTHER PUBLICATIONS

3D Quantum Dot Lattice Inside Mesoporous Silica Films by Sopjie Besson et al., Nano Letters, vol. 2, No. 4, pp. 409-414, 2002.*

* cited by examiner

*Primary Examiner* — Tram H Nguyen
(74) *Attorney, Agent, or Firm* — Bond, Schoeneck & King, PLLC; William Greener; Erin Phillips

(57) ABSTRACT

A composite material for fluorescent quantum dot micro-nano packaging. The composite material comprises fluorescent quantum dots, a mesoporous particle material having a nanometer lattice structure, and a barrier layer, wherein the fluorescent quantum dots are distributed in the mesoporous particle material, and the barrier layer is coated on the outer surface of the mesoporous particle material. In the composite material according to the invention, the quantum dot aggregation can be effectively retarded, with the barrier layer coated on the surface the water-oxygen micromolecule erosion is prevented, the compatibility and stability of the composite fluorescent particles is improved, and the service life of the composite material for fluorescent quantum dot micro-nano packaging is thus greatly improved.

6 Claims, 3 Drawing Sheets

COMPOSITE MATERIAL FOR FLUORESCENT QUANTUM DOT MICRO-NANO PACKAGING

RELATED APPLICATION DATA

The instant application claims priority to Chinese Patent Application No. 201510576368.7, CN filed 11 Sep. 2015, the subject matter of which is incorporated by reference herein in its entirety.

TECHNICAL FIELD

The present invention relates to a fluorescent material, and more particularly, to a composite material for fluorescent quantum dot micro-nano packaging.

BACKGROUND

High-luminous-efficiency and high-stability quantum-dot-based micro-nano-packaged fluorescent powder is used in quantum dot optimized white LEDs generally for regulating the color rendering index of the white LEDs, and is used in tricolor (red/green/blue) LED devices for displaying so as to improve the color gamut of a display as well.

Colloidal quantum dot has the advantages of continuously adjustable light emitting, high purity of color of emitted light and higher conversion efficiency, and has a relatively mature preparation technology as a core material for next generation lighting and displaying technology. In order to reduce or eliminate surface defects (e.g. intrinsic crystal growth defects and dangling bonds) of the quantum dots, a method commonly adopted is to epitaxially grow an inorganic shell on the surface of the quantum dot. However, as a nanocrystal particle having an inorganic shell structure, it still has very high surface energy, and changing the circumstance of the quantum dot may possibly cause clustering and fluorescence quenching of the quantum dots. In order to increase the self-stability of the quantum dots and the stability thereof in a composite material, a surfactant is usually used in organic modification on the surface of the quantum dots to obtain colloidal quantum dots.

In general, the quantum dots cannot be directly used because the quantum dots are relatively unstable compared to bulk materials. The quantum dots themselves may cluster to form larger particles. In addition, the colloidal layer may be eroded easily, and thus a defect level is left, forming a non-radiative channel. Most of the physical and chemical circumstances will cause fluorescence quenching to the quantum dots. Therefore, how to passivate quantum dot is a relatively hot and critical issue at present.

In practice, a common method is to directly disperse the quantum dots into a polymer matrix to obtain a fluorescent composite material, forming a simple structure for "quantum dot carrier material". The composite material substantially maintains the fluorescence characteristics from the colloidal quantum dots. After that, the composite material is directly applied in a blue LED to obtain white light, or a multicolor spectrum converted by the quantum dot, respectively for direct use in displaying and lighting.

Some conventional methods for packaging quantum dots in present literatures include the followings. 1. Dispersing the quantum dots into polymethyl methacrylate (PMMA), wherein remote packaging (see reference 1) is used. This packaging form has the defects that the quantum dots will aggregate in the PMMA slowly, leading to fluorescence radiation wavelength red shift and fluorescence efficiency drop as the quantum dots are not compatible with surface ligands and barrier layer. Secondly, as the water-resistance and oxygen-resistance abilities of the PMMA are poor, the osmotic water-oxygen micromolecules may easily erode the surfaces of the quantum dots, leading to fluorescence drop. 2. Coating on chip (On chip) (see reference 2) packaging. In order to prevent the quantum dots from aggregation, a transamination treatment is conducted on the surfaces of the quantum dots firstly, to enhance the compatibility between the quantum dots and the barrier layer material around the quantum dots, thereby to decrease aggregation and prevent water and oxygen erosion. However, this transamination itself may easily destroy the surface ligands of the quantum dots, thus affecting the initial fluorescence efficiency of the quantum dots.

Furthermore, the quantum dots are relatively sensitive to temperature, oxygen and water. Even in a composite material, the quantum dots may fallen off, leading to fluorescence drop, due to long-term oxidation of the surface ligands of the colloidal quantum dots and incompatible problem between the quantum dots and the polymer carrier material, this severely affects the service life of a device. In order to improve the service life of the quantum dot device, improvement is made based on the remote packaging. A silica (silica)/polyvinylpyrrolidone (PVP) material has been used as a barrier layer in remote packaging (see reference 3). A composite film with surface protection is introduced, specifically a film having better water-resistance and oxygen-resistance ability is added between an upper layer and a lower layer for preventing water and oxygen invasion, thereby to reduce damages to the surfaces of the quantum dots. Although with this method the water and oxygen may be obstructed to a certain extent, ligand loss and aggregation effect caused by compatible problem between the outer surfaces of the quantum dots and a carrier cannot be avoided, thus the stability and reliability of a light emitting device are impaired.

For a method of directly compositing the quantum dots with silica gel, the colloidal ligand at the outer layer of the quantum dots is not compatible with the silica gel. In particular, some surface ligands containing sulfur (S) will be effected with platinum (Pt) in the silica gel, and thus the solidification of the silica gel will be affected, the silica gel may not solidify. In addition, a non-solidified silica gel will usually cause clustering due to the compatibility problem between the surface ligands and the silica gel.

For a quantum dot polymer composite material, the fluorescence characteristics of the quantum dot polymer material obtained via polymerization in a quantum dot dispersion liquid are usually affected by an initiator, a polymer active site or the like, or fluorescence drop or quenching may occur as affected by a high polymer chemistry molecule polymerization reaction. Similarly, for a physical blending composite material, which is obtained through directly dissolving a high polymer using a solvent, then dispersing the quantum dots, and volatilizing the solvent, clustering of the quantum dots is caused due to the compatibility problem between the quantum dots and the polymer. On the other hand, due to osmosis, the micromolecules, for example, water molecules and oxygen, usually interacts with the quantum dots, eroding the surfaces of the quantum dots, thereby leading to light emitting defects and fluorescence efficiency recession.

Direct processing, such as silica growing and surface transamination modification, is conducted on the surfaces of the quantum dots. The method presently has a major problem that an apparent fluorescence quenching effect (see reference 4) may occur for the quantum dots due to the substitution of the surface ligands. Therefore, for the use of the high-luminous-efficiency and high-stability quantum dots in a device, the following problems have to be solved: 1. the quantum efficiency of the quantum dots cannot be impaired during the surface treatment of the quantum dots or composition with other materials; 2. the carrier circumstance of the quantum dots shall be compatible with the surfaces of the quantum dots, this prevents the quantum dots from self-aggregation on one hand, and prevents the ligands from falling off on the other hand; and 3. a barrier layer is set to prevent micromolecules like water vapor and oxygen from eroding the surfaces of the quantum dots.

SUMMARY

In order to solve the foregoing technical problems, the present invention particularly provides a composite material for fluorescent quantum dot micro-nano packaging. According to the invention, the fluorescent quantum dots enter a mesoporous particle material through a non-chemical way (e.g. heating infiltration). Under a nonpolar solvent circumstance, without destroying the surface structure of the colloidal quantum dots, the method maintains the fluorescence efficiency of the quantum dots. According to the invention, a method of performing heating infiltration and solution volatilization enables more quantum dots to completely enter the mesoporous particle material, so as to obtain the micro-nano fluorescent particles. The mesoporous particle material can prevent the fluorescent quantum dots from aggregation to a great extent. The barrier layer grown on the surface of the fluorescent micro particles prevents micromolecule (e.g. water and oxygen) erosion, and improves the compatibility and stability of the composite fluorescent particles as well.

The technical solution employed in the present invention can be described as follows: a composite material for fluorescent quantum dot micro-nano packaging, characterized in that, the composite material comprises fluorescent quantum dots, a mesoporous particle material with a nanometer lattice structure, and a barrier layer, wherein the fluorescent quantum dots are distributed in the mesoporous particle material, and the barrier layer is coated on the outer surface of the mesoporous particle material.

The fluorescent quantum dots according to the present invention are fluorescent nanocrystals with a size of 2 nm to 20 nm and surface ligands thereof.

The particle size of the mesoporous particle material according to the present invention ranges from 0.05 to 500 μm.

The mesoporous aperture of the mesoporous particle material according to the present invention ranges from 2 nm to 50 nm The mesoporous particle material according to the present invention is any one (but not limited to) of a mesoporous silica material, a mesoporous titania material, a mesoporous zinc oxide material, a molecular sieve and a metal-organic framework compound.

The barrier layer according to the present invention is any one (but not limited to) of a silica barrier layer, a titania barrier layer, wax materials and a polymer barrier layer.

The present invention has the advantageous effects as follows: the fluorescent quantum dots enter the mesoporous particle material in a non-chemical way (heating infiltration and solvent volatilization), and thus the surface structure of the colloidal quantum dots will not be impaired under a nonpolar solvent circumstance, and the fluorescence efficiency of the quantum dots is consequently maintained; the structure can effectively retard the aggregation of the quantum dots, the barrier layer coated on the surface prevents the erosion of water-oxygen micromolecules, and improves the compatibility and stability of the composite fluorescent particles as well.

The specific effects and characteristics are as follows:
1. Because the surface groups of the fluorescent quantum dots are not impaired, the fluorescence efficiency of the quantum dot may be well reserved, and the fluorescent particles obtained have higher fluorescence efficiency.
2. Due to the nanometer lattice effect of the mesoporous particle material, the quenching effect caused by the clustering of the fluorescent quantum dots is reduced; in addition to above, due to mesoporous confinement, the direct contact with the water and oxygen in the air is greatly reduced; the fluorescent particles protected by the barrier layer can be completed isolated from the water and oxygen in the external air; resulting from above, the service life of the composite material for fluorescent quantum dot micro-nano packaging is greatly improved.
3. The micro-nano packaging enables the fluorescent quantum dots to be used as the normal phosphors; the fluorescent quantum dots can either be used solely, or in mixture with other materials (e.g. silicone); in this way, diversification in use is achieved.

The term 'about' means the amount of the specified quantity plus/minus a fractional amount (e.g., +10%, +9%, +8%, +7%, +6%, +5%, +4%, +3%, +2%, +1%, etc.) thereof that a person skilled in the art would recognize as typical and reasonable for that particular quantity or measurement.

The term 'substantially' means as close to or similar to the specified term being modified as a person skilled in the art would recognize as typical and reasonable; for e.g., within typical manufacturing and/or assembly tolerances, as opposed to being intentionally different by design and implementation.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

DETAILED DESCRIPTION OF NON-LIMITING, EXEMPLARY EMBODIMENTS

The present invention will be further described in details hereinafter with reference to the drawings and embodiments.

Figure 4:
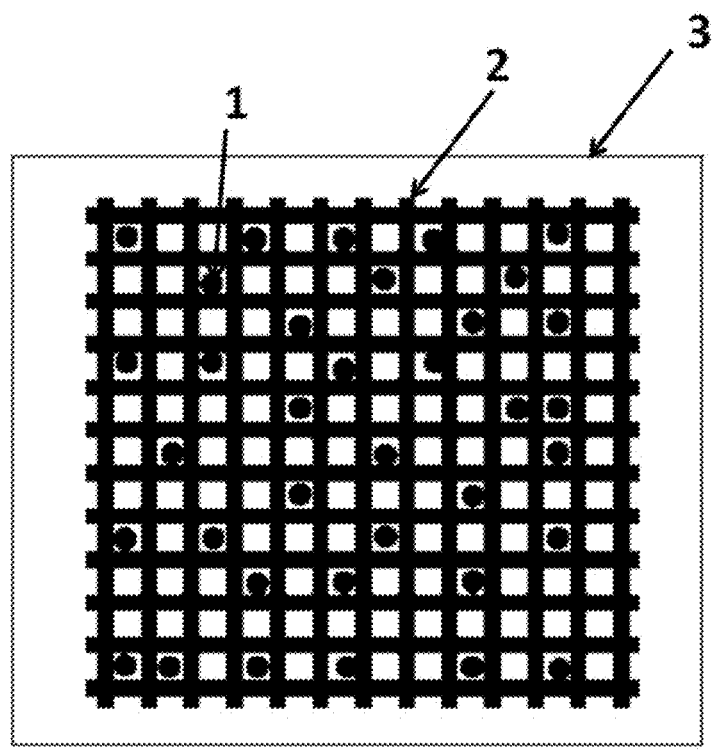
FIG. 4 is a schematic view showing a final composite material after step V of the preparation method.
Figure 5:
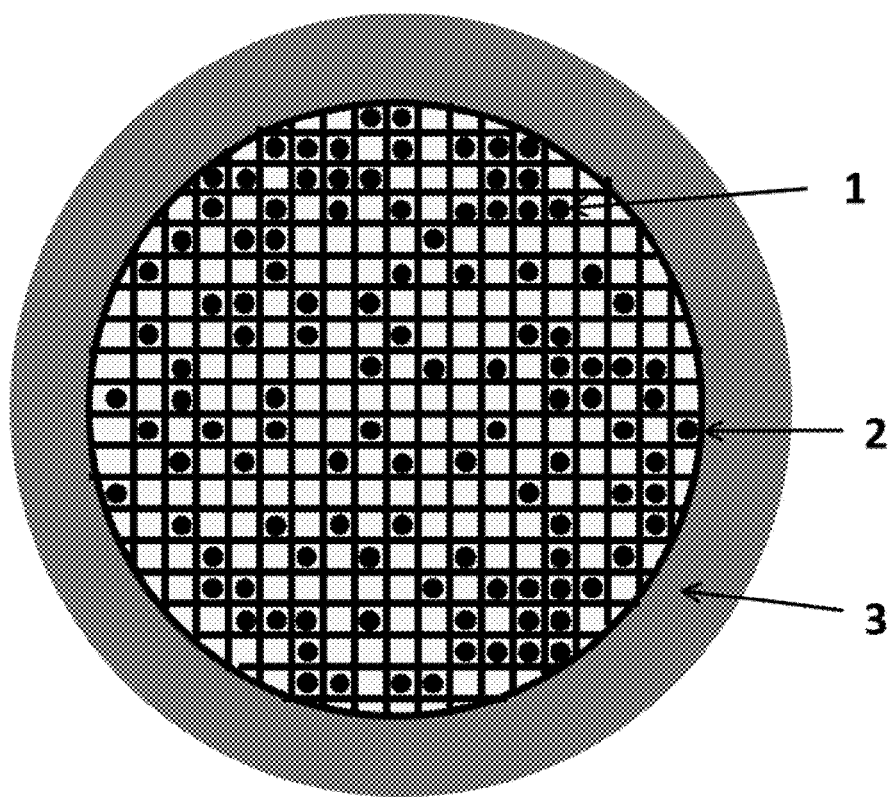
FIG. 5 is a 2D view showing a partial section of the final composite material.

Referring to FIG. 4 and FIG. 5, a composite material for fluorescent quantum dot micro-nano packaging comprises fluorescent quantum dots 1, a mesoporous particle material 2 having a nanometer lattice structure, and a barrier layer 3, wherein the fluorescent quantum dots 1 are distributed in the mesoporous particle material 2, and the barrier layer 3 is coated on the outer surface of the mesoporous particle material 2.

The size of the fluorescent quantum dots ranges from 2 nm to 20 nm. The applicability of the mesoporous particle material 2 is not limited by its external shape, the mesoporous particle material may be in a spherical shape, a cube or an irregular shape.

The particle size of the mesoporous particle material 2 ranges from 0.05 to 500 μm. The mesoporous aperture of the mesoporous particle material 2 ranges from 2 nm to 50 nm. The mesoporous particle material 2 may be any one (but not limited to) of a mesoporous silica material, a mesoporous titania material, a mesoporous zinc oxide material, a molecular sieve and a metal-organic framework compound. The barrier layer 2 may be any one (but not limited to) of a silica barrier layer, a titania barrier layer, wax materials and a polymer barrier layer.

According to an embodiment of the invention, a preparation method for the composite material for fluorescent quantum dot micro-nano package comprises the following steps:

Step I. The fluorescent quantum dots are processed with a purification treatment (e.g. extraction and centrifugation) before use, and the average size of the fluorescent quantum dots is 4 to 6 nm; the mesoporous particle material 2 is a mesoporous silica material, of which the particle size ranges from 30 to 60 μm (the size distribution may be uneven), and of which the mesoporous aperture ranges from 7 to 8 nm; the mesoporous particle material 2 is processed with a dehydroxylation treatment (e.g. vacuum calcination, and silica surface treatment) before used.

Figure 1:
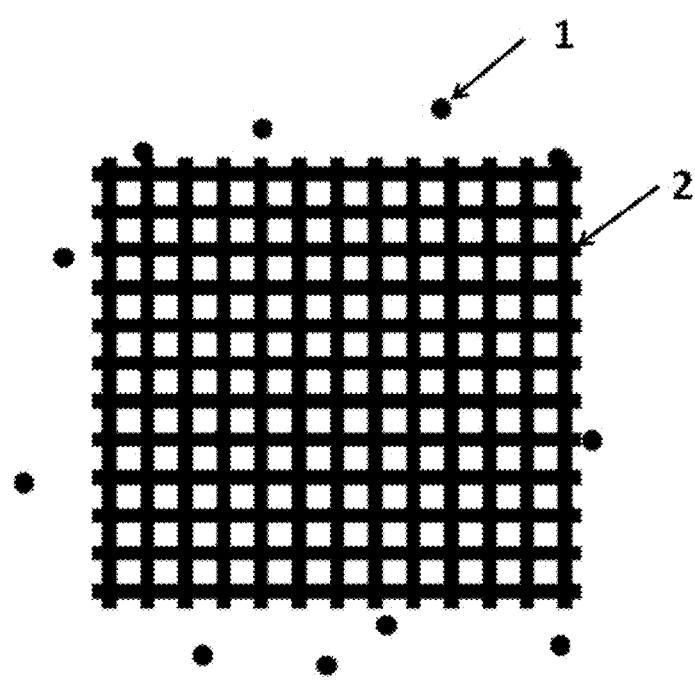
FIG. 1 is a schematic view showing a resulting composite material after step II of a preparation method.

Step II. The fluorescent quantum dots and the mesoporous silica particles are dispersed into a 98% normal hexane solution contained in a vessel successively, stirred at a high speed, ultra-sonicated for 1 h, and sealed and soaked for 2 h; the purpose of soaking is to increase the compatibility of the mesoporous particle material, and to promote the recombination of the mesoporous particle material with the fluorescent quantum dots. The resulting composite material after soaked is as shown in FIG. 1.

Figure 2:
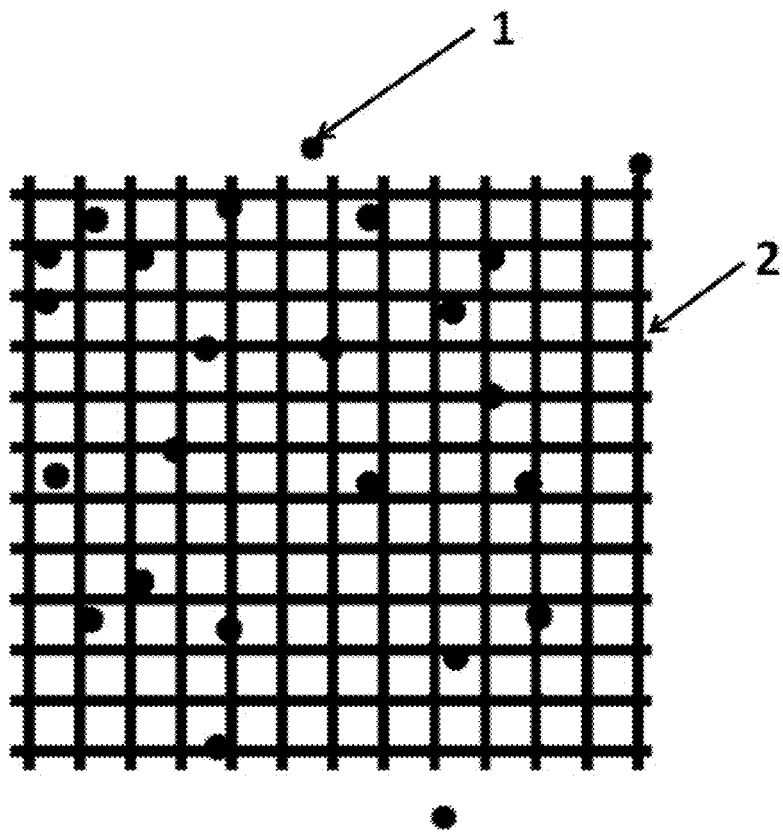
FIG. 2 is a schematic view showing a resulting composite material after step III of the preparation method.

Step III. The vessel is opened and heated by a heating equipment, so that the mixed liquid therein is heated to a temperature of 60 to 70° C., and then the liquid is stirred quickly, at the same time a normal hexane solution is added in constantly as supplementary to the volatilized solution, making the mesoporous silica particles swell in the heated solution to enable a part of the fluorescent quantum dots to infiltrate the mesoporous particle material through thermal motion; this swelling process lasts for 10 h. The result of the swelling process is as shown in FIG. 2, in which the mesoporous particle material is swelled, and the quantum dots enter the nanometer lattice of the mesoporous particle material 2.

Alternatively, a reflux unit may be used in this process to further simplify the operation and save the volatilization solvent. As without the reflux unit the solution volatilizes constantly and new solution is added in as complementary, the concentration of the solution is constantly changed, with such an approach the fluorescent quantum dots can permeate the mesoporous particle material in a more effective manner. This "swelling-solution volatilization" process is repeated for 1-10 h.

Figure 3:
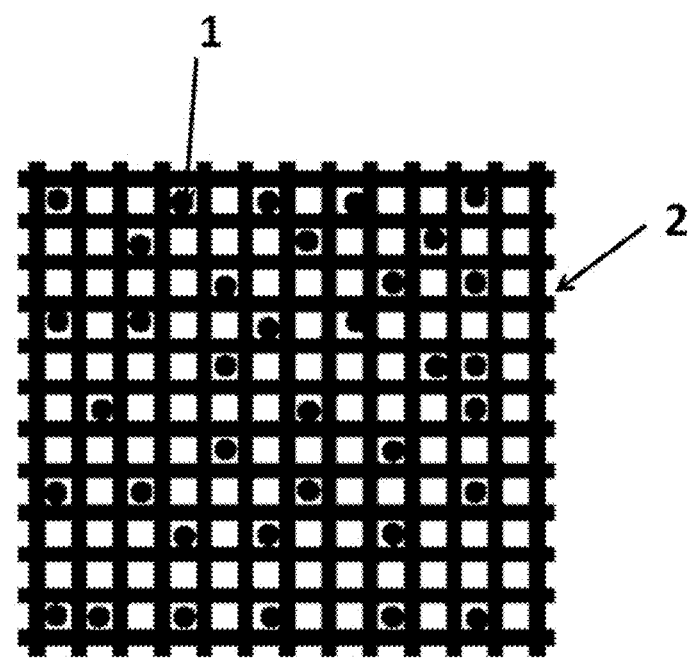
FIG. 3 is a schematic view showing a resulting composite material after step IV of the preparation method.

Step IV. After the normal hexane solution in the vessel has completely volatilized, the mixture cools down naturally under the protection of argon gas, and then is dried in a vacuum drying oven, the fluorescent particles composited by the fluorescent quantum dots and the mesoporous material are thus obtained. The resulting composite material in this stage is as shown in FIG. 3.

Step V. The fluorescent particles are re-dispersed into anhydrous alcohol, and a 99.99% ethyl orthosilicate is added in and the mixture is stirred evenly, and then alkaline water or aqueous ammonia is dropwise added in, and the resulting mixture is stirred in an accelerated speed to hydrolyze the ethyl orthosilicate and grow a silica barrier layer. The final composite material is as shown in FIG. 4 and FIG. 5.

The working principle of the present invention could be described as: a micro-nano packaged quantum dot technology is employed. Firstly, a non-chemical approach, e.g. physical swelling, prompts the fluorescent quantum dots to permeate the mesoporous particle material (nanometer lattice structure), which does not impair the surface colloidal structure of the fluorescent quantum dots, thereby ensuring the fluorescence efficiency of the fluorescent quantum dots. Secondly, the mesoporous particle material will not react with the surface of the fluorescent quantum dots, and the mesoporous structure will restrict the aggregation of the fluorescent quantum dots, and lock the fluorescent quantum dots at a fixed position, thereby obtaining the micro-nano particles, i.e. fluorescent particles, composited by a nanometer-mesoporous particle material. Finally, a barrier layer is grown on the surface of the above micro-nano particles to prevent water and oxygen from entering the mesoporous structure, thereby preventing micromolecules from eroding the surface of the fluorescent quantum dots. Such quantum dot composite fluorescent particles obtained may be applied to packaging of any forms, and may be applied to micro-nano packaging for any particles as well, not limited by the quantum dot materials. In addition, such quantum dot composite fluorescent particles may be applied to display and lighting technology, not limited by the application scope. This technology may prompts the industrialization and marketization of the quantum dots.

Quantum dots: the fluorescent quantum dots are light emitting nanocrystals and organic surface ligands thereof, to be specific, II-IV family quantum dots like CdSe, CdS, ZnSe, ZnS, and PbS; III-V family quantum dots like InP; II-III-IV family quantum dots like CuInS2; doped quantum dots like Cu:ZnS, Cu:ZnSe, Mn:ZnSe, and Mn:ZnS; and the quantum dots also include the foregoing quantum dots and surface passivated quantum dots thereof, shell structure quantum dots like CdSe/ZnS, CdSe/CdS, CdSe/ZnSe, and PbS/ZnS; multi-shell structure quantum dots like CdSe/CdS/ZnS; and such fluorescent quantum dots subjected to organic surface treatment like perovskite quantum dots and carbon quantum dots. Other fluorescent nanometer particles like quantum rods (QR) and quantum well (QW) are also included.

The mesoporous particle material (nanometer lattice structure) is used in a physical treatment on the fluorescent quantum dots, thereby to internally package the fluorescent quantum dots, so that the fluorescent quantum dots permeate the nanometer lattice structure or pores of the mesoporous particle material under a non-chemical treatment condition. The benefit of using the non-chemical method is to not impair the organic layer ligands on the surfaces of the fluorescent quantum dots, so as to protect the fluorescence characteristics of the quantum dots. A non-chemical reaction method is used to feed the fluorescent quantum dots into the pores of the mesoporous particle material without impair the fluorescence characteristics of the quantum dots. The major methods adopted may be one of a swelling method, a soaking method, a solvent vaporization method, an ultrasound dispersing method, or combinations thereof.

Regarding the pretreatment on the mesoporous particle material, the active groups on the surface of the mesoporous particle material are passivated, the compatibility between the micro-nano mesoporous particle material and the fluorescent quantum dots is increased, no reactive micromolecules are released, and no contact with the surface of the material and no energy transfer occur, so that the fluorescence efficiency of the quantum dots is not impaired. Specifically, a physical method, e.g. one of evacuation, sintering and the combination thereof, is adopted. A chemical method is one of solution pretreatment, solution reaction method and the combination thereof, of which main purpose is to eliminate or reduce the groups or the micromolecules adsorbed on the surface of the mesoporous particle material, which makes the quantum dot fluorescence unstable.

A post-treatment method for micro-nano packaging is to grow/coat a barrier layer on the surface of the fluorescent particles, which mainly plays a role of completely encapsulating the fluorescent quantum dots, disabling the fluorescent quantum dots to move to the outer layer of the structure, and obstructing an outer layer substance to enter the nanometer lattice structure housing the quantum dots, so that the fluorescent quantum dots are isolated from the outside. The substances from outside may substantially be molecules like water and oxygen, that may possibly react with the surfaces of the quantum dots. The barrier layer mainly comprises silica, titania, polymer and the like, but not limited to this.

In a specific embodiment, the preparation method may be further expanded as follows:
1. The fluorescent quantum dots may be grown in situ under the presence of a mesoporous structure.
2. A carrier material for mesoporous structure may be formed in situ under the presence of the quantum dots.
3. The quantum dots may be absorbed on the mesoporous particle material and permeate the surface of the mesoporous particle material or an internal mesoporous particle material through manners such as swelling, soaking, ultrasound and the like. The present invention is not limited to the foregoing manner or other certain manner that allows the fluorescent quantum dots to permeate the mesoporous particle material.
4. The surface finishing of the inner surface of the mesoporous particle material, e.g. eliminating hydroxyl radical and other active groups, may be implemented through the manners such as vacuum calcination and chemical-surface treatment, so as to ensure the compatibility between the fluorescent quantum dots and the mesoporous particle material, and fluorescence stability. The present invention is not limited to a certain manner for interface processing between the fluorescent quantum dots and the mesoporous particle material.

While several inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

It should also be understood that, unless clearly indicated to the contrary, in any methods claimed herein that include more than one step or act, the order of the steps or acts of the method is not necessarily limited to the order in which the steps or acts of the method are recited.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

REFERENCES

1. J. Eun-Pyo, S. Woo-Seuk, L. Ki-Heon, Y. Heesun, *Nanotechnology* 2013, 24, 045607 (9 pp.).
2. E. Jang, S. Jun, H. Jang, J. Llim, B. Kim, Y. Kim, *Advanced Materials* 2010, 22, 3076.
3. J. Eun-Pyo, S. Woo-Seuk, L. Ki-Heon, Y. Heesun, *Nanotechnology* 2013, 24, 045607 (9 pp.).
4. Annals of Biomedical Engineering, Vol. 37, No. 10, October 2009 (2009) pp. 1960-1966

We claim:

1. A composite material, comprising:
   fluorescent quantum dots;
   a mesoporous particle material having a nanometer lattice structure; and
   a barrier layer impermeable to fluid,
   wherein the fluorescent quantum dots are distributed in the mesoporous particle material, and the barrier layer is completely coated on an outer surface of the mesoporous particle material.

2. The composite material according to claim 1, wherein the fluorescent quantum dots are fluorescent nanocrystals and surface ligands thereof, having a size of 2 nm-20 nm.

3. The composite material according to claim 2, wherein a particle size of the mesoporous particle material ranges from 0.05 to 500 m.

4. The composite material according to claim 3, wherein a mesoporous aperture of the mesoporous particle material ranges from 2 nm to 50 nm.

5. The composite material according to claim 4, wherein a material of the mesoporous particle material is any one of a mesoporous silica material, a mesoporous titania material, a mesoporous zinc oxide material, a molecular sieve, and a metal-organic framework compound.

6. The composite material according to claim 5, wherein the barrier layer is any one of a silica barrier layer, a titania barrier layer, wax materials and a polymer barrier layer.

* * * * *

UNITED STATES PATENT AND TRADEMARK OFFICE
CERTIFICATE OF CORRECTION

| | | |
|---|---|---|
| PATENT NO. | : 9,577,127 B1 | Page 1 of 1 |
| APPLICATION NO. | : 14/963940 | |
| DATED | : February 21, 2017 | |
| INVENTOR(S) | : Wang et al. | |

It is certified that error appears in the above-identified patent and that said Letters Patent is hereby corrected as shown below:

In the Claims

Column 10, Line 24, Claim 3, change "500 m" to --500 μm--.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*